United States Patent [19]

Million et al.

[11] Patent Number: 5,669,522
[45] Date of Patent: Sep. 23, 1997

[54] FASTENER ARRANGEMENT FOR AN ENCLOSURE

[75] Inventors: James F. Million, Columbus; Raymond J. Ichrist, Galena, both of Ohio

[73] Assignee: Mettler-Toledo, Inc., Worthington, Ohio

[21] Appl. No.: 609,884

[22] Filed: Mar. 1, 1996

[51] Int. Cl.$^6$ .................................................. G01G 21/28
[52] U.S. Cl. ........................ 220/4.02; 177/181; 220/784
[58] Field of Search .................................. 177/180–182, 177/238, 239, 243, 244; 206/701; 220/306–308, 4.02, 784

[56] References Cited

U.S. PATENT DOCUMENTS

| | | | |
|---|---|---|---|
| 2,622,869 | 12/1952 | Van Duyn | 177/182 |
| 3,759,415 | 9/1973 | Cloyd | 220/306 |
| 3,814,278 | 6/1974 | Beierle | 220/308 |
| 5,046,632 | 9/1991 | Bordner | 220/306 |

*Primary Examiner*—Jimmy G. Foster

[57] ABSTRACT

An enclosure for housing electronic circuitry having a base and a cover with side walls includes a non-exposed fastening mechanism for securing, sealing, centering, and releasing the cover relative to the base. The fastening mechanism includes a ledge on the inside of a cover side wall and a restraining clip having a fixed leg mounted to the base and a flexible leg movable towards and away from the fixed leg and which engages the ledge when the cover is positioned on the base. A resilient gasket is fastened to the cover and positioned to seal the cover to the base and to be resiliently compressed when the cover is positioned on the base. The resilient compression of the gasket maintains the flexible leg in contact with the ledge to secure the cover to the base. The flexible leg also maintains the cover side wall away from the base. Several restraining clips are spaced apart on the base so that the flexible legs center the cover in at least one direction relative to the base. Access holes are provided through the cover to allow a screwdriver or other implement to pass therethru to move the flexible leg towards its respective fixed leg and thereby disengage the flexible leg from the ledge, releasing the cover from the base. The restraining clip is further provided with a projection to prevent overtravel of the flexible leg when releasing the cover from the base.

16 Claims, 3 Drawing Sheets

FASTENER ARRANGEMENT FOR AN ENCLOSURE

BACKGROUND OF THE INVENTION

This invention relates to enclosures having a cover removable or openable with respect to a base and more particularly to such an apparatus having an improved arrangement for securing, sealing and centering the cover relative to the base and for releasing the cover from the base.

Enclosures with removable or openable covers are used in many differing applications. In the scale industry, such enclosures are typically used as indicators and house various circuitry to display the weight of a load on a scale. Such enclosures typically include a base to house various circuitry for receiving, processing and sometimes transmitting signals to and from a scale and other devices, and a cover to enclose the base. The covers of such apparatus normally include a window for viewing a display of the weight of a load on a scale and can include a keyboard for data and program entry as well as for calibration of the scale.

Typically, the covers of such enclosures are connected to the base via a hinge mounted between a side of the base and a side of the cover. One or more latches, of varying types such as screw or twist type latches, are typically mounted on the outside of one or more of the non-hinged sides of the base and mate with a receiver on the cover to then secure the cover to the base. Other enclosures may not use a hinge at all but may employ multiple latches to secure the cover to the base. Still other enclosures use multiple screws or bolts to secure the cover to the base. In addition, these enclosures also typically include some type of gasket to form a seal between the cover and base to protect the circuitry housed therein from environmental damage.

However, it has been found that such enclosure fastening arrangements have several disadvantages. A principal disadvantage is that use of such fasteners requires relatively tight manufacturing tolerances to insure that the cover is properly sized and aligned with respect to the base and that the latches, hinge, screws or bolts are mounted in the correct positions to enable the cover to be properly secured to the base and provide a good seal therebetween. These relatively tight manufacturing tolerances add cost and complexity to the manufacturing process for such enclosures. Another disadvantage is that the multiple types and or pieces of hardware which comprise such fastening arrangements also add cost and complexity to the production of such enclosures. A further disadvantage is that such fasteners can be difficult to fasten and unfasten in harsh environments, for example, where cold temperatures impair hand dexterity, screw type latches may be difficult to operate. Also found to be disadvantageous is that such fasteners, mounted on the outside of the enclosure, are prone to corrosion from being directly exposed to the elements and are subject to damage, particularly in industrial environments, where equipment and machinery are moved about. Additionally disadvantageous, such fasteners present numerous exposed irregular surfaces that can entrap debris during normal use, such as in food processing environments.

SUMMARY OF THE INVENTION

An object of the present invention is to provide a fastening mechanism for such enclosures which substantially eliminates the problems and disadvantages referred to above with known enclosure fastening mechanisms.

Another object of the present invention is to provide a fastening arrangement which allows for greater manufacturing tolerances in making the cover and the base and in aligning, positioning and mounting the fastener components thereto.

Yet another object is to provide a fastening mechanism which eliminates or greatly reduces the exposure of the fastening components to damage, corrosion and collection of debris.

The inventors of the present invention have solved the problems presented by such exposed fastening arrangements. According to one aspect of the invention, there is provided an enclosure for housing electronic circuitry, including a base and a cover. The base includes a side wall and the cover includes a side wall having an outside surface and an inside surface. The base and cover are configured so that the cover side wall faces the base side wall when the cover is positioned on the base. The cover is secured to the base with a non-exposed fastener arrangement that also seals and centers the cover relative to the base; access is also provided to release the non-exposed fastener arrangement in order to release the secured cover from the base.

Preferably, the non-exposed fastener arrangement includes a ledge on the inside surface of the cover side wall and a restraining clip mounted to the base. The restraining clip includes a fixed leg and a flexible leg. The flexible leg is of a predetermined length and extends at a predetermined angle relative to the fixed leg. The fixed leg is mounted to the base in a position so that the flexible leg engages the ledge when the cover is positioned on the base. A resilient gasket is fastened to the cover in a position to be resiliently compressed when the cover is positioned on the base. The opposition of the gasket to compression maintains the flexible leg in contact with the ledge to secure the cover to the base.

To seal the enclosure, the gasket extends around the perimeter of the cover to define a seal between the cover and the base when the cover is secured to the base.

The centering feature of the non-exposed fastener arrangement is attributable to the flexible leg which behaves like a spring and is movable towards and away from the fixed leg; the flexible leg will tend to return to a normal position after a moving force is removed. Multiple restraining clips are mounted to the base so that the flexible leg of each restraining clip is depressed towards its fixed leg when the cover is secured to the base, thereby resulting in the flexible legs exerting force against the cover side wall to maintain the cover side wall away from the base. Further, by mounting the restraining clips in spaced apart locations so that the action of one flexible leg will generally oppose the action of another flexible leg, the cover will be centered, in at least one direction, relative to the base.

To release the secured cover from the base, holes are provided through the cover to allow a screwdriver or other implement to pass therethru to depress the flexible leg toward its fixed leg and disengage the flexible leg from the ledge. An overload stop is provided between the fixed leg and flexible leg to prevent the flexible leg from being flexed too far.

By providing an enclosure with such a non-exposed fastener arrangement, the disadvantages of conventional enclosure fastening arrangements are avoided.

DESCRIPTION OF A PREFERRED EMBODIMENT

Figure 1:
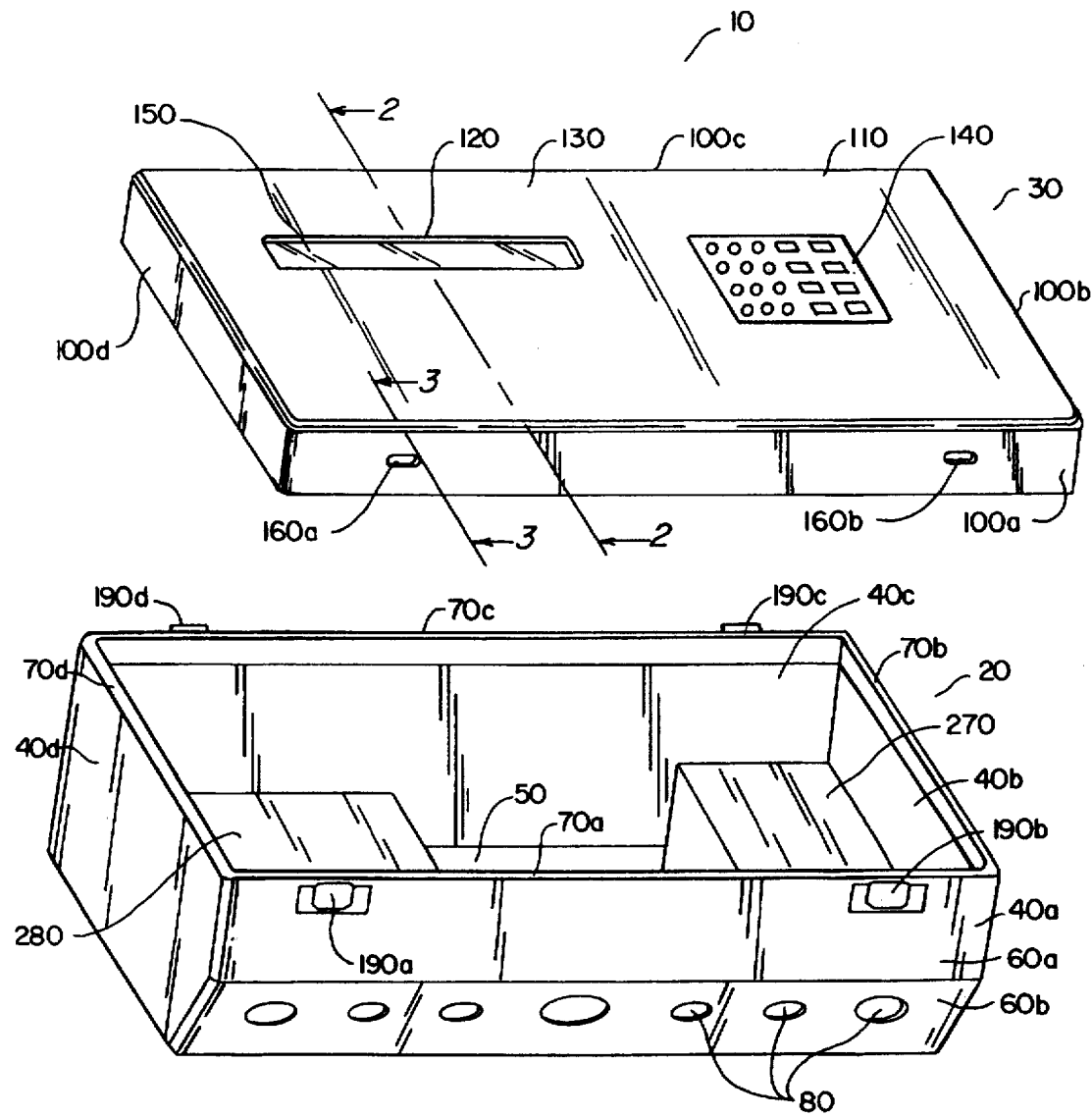
FIG. 1 is a perspective view of an enclosure, with cover shown removed, incorporating a preferred embodiment of the present invention.

Referring initially to FIG. 1, there is shown a perspective view of an enclosure, denoted as 10, embodying the present invention. Enclosure 10 includes a base 20, for housing various circuitry, and a cover 30, shown removed.

Figure 3:
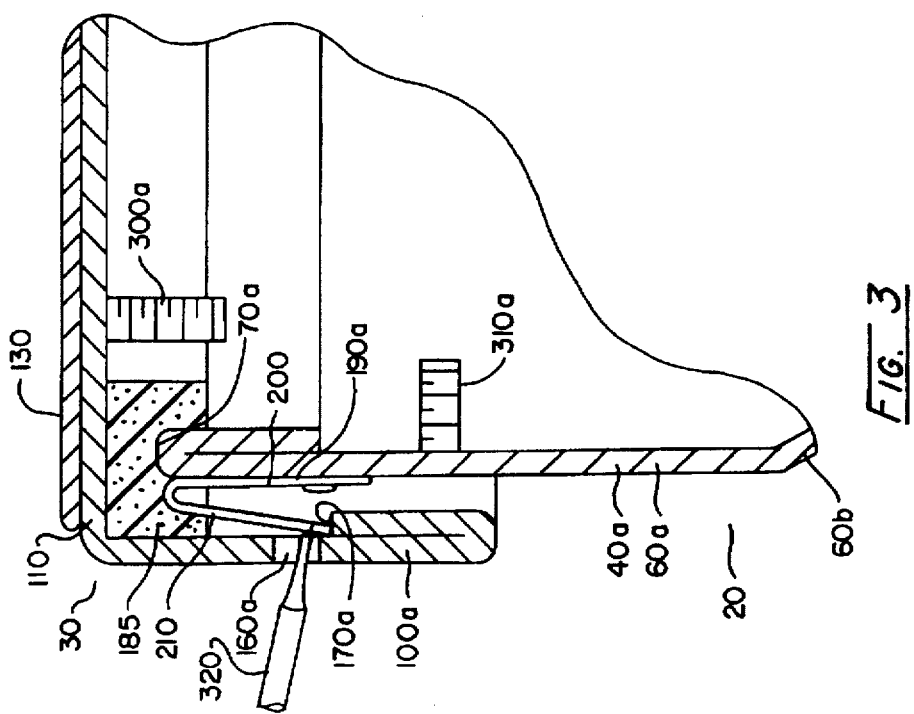
FIG. 3 is a transverse sectional view taken on the line 3—3 of FIG. 1, with the cover secured to the base.

Base 20 is preferably formed from sixteen gauge stainless steel, cut and bent to form a rectangularly shaped box with four side walls 40a, 40b, 40c, 40d and floor 50. Although not necessary to the object of the present invention, side wall 40a is further shaped to form two surfaces 60a, 60b; side walls 40b and 40d are cut to conform to the angle made by the bend of surfaces 60a–b of side wall 40a. As can be seen in FIG. 1 and FIG. 3, the top portion of side walls 40a–d are each bent inward and downward to form a doubled edge 70a, 70b, 70c, 70d. The importance of doubled edges 70a–d will be explained below. After being thus cut, bent and formed, the joints on the inside of base 20, where side walls 40a–d meet, are welded (not shown) to add strength to the formed base 20.

Still looking at FIG. 1, various size holes, generally designated 80, are punched through surface 60b to allow electrical connections for power and from outside instruments and devices, such as a scale and a printer, to be made with miscellaneous circuitry inside enclosure 10. The punching out of holes 80 is preferably done prior to the stainless steel sheet of metal being bent to form base side walls 40a–d. Cord grip bushings, denoted as 90 (FIG. 2), such as a Heyco® Liquid Tight Straight-Thru Fitting available from Heyco® Molded Products, Inc. of Kenilworth, N.J., are inserted into holes 80 and used to provide a National Electrical Manufacturers Association (hereinafter "NEMA") type 4 waterproof seal for the electrical connections passing therethru.

Figure 5:
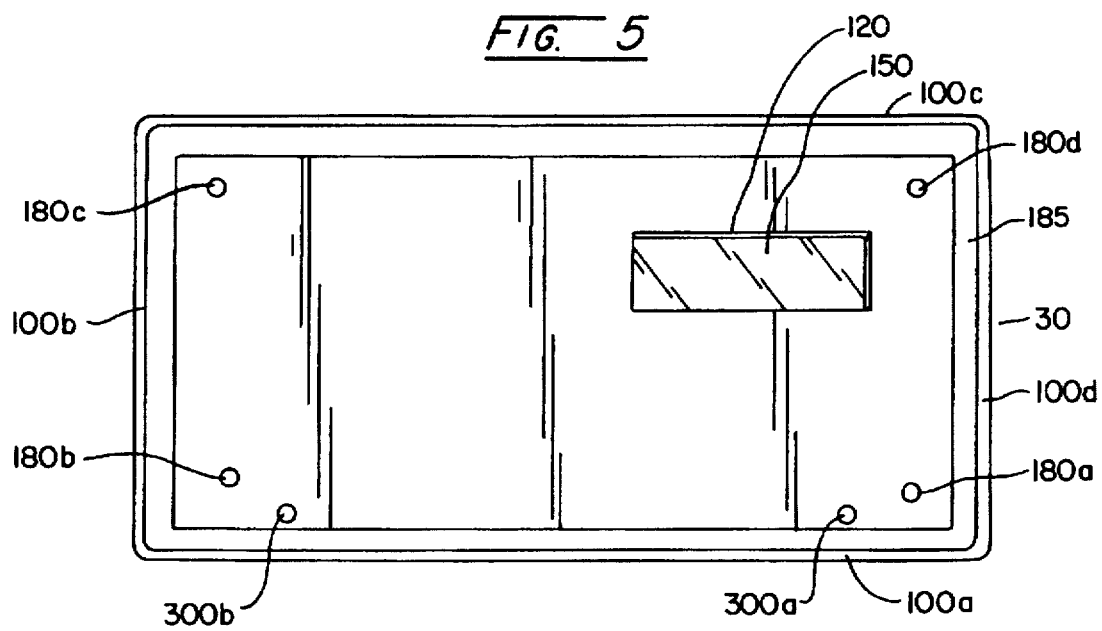
FIG. 5 is a bottom view of the cover shown in FIG. 1.

Cover 30 is constructed in a manner similar to base 20. Referring to FIGS. 1,3,5 cover 30 is also preferably formed from sixteen gauge stainless steel bent to form a rectangularly shaped lid with four side walls 100a, 100b, 100c, 100d and top 110. A window slot 120 is cut in top 110 of cover 30, for allowing viewing of a display as will be further explained below. A polyester overlay 130, including a keyboard assembly 140 and a transparent window section 150, for lining up with window slot 120, is fastened to top 110 of cover 30 via adhesive backing which is part of polyester overlay 130. Overlay 130 is a multi-layered component constructed by use of silk-screening techniques, well known in the art, such as is available from Dyna-Graphics, Inc., Chaska, Minn.

Two holes, in the form of releasing slots 160a, 160b, are punched through side 100a of cover 30. The function and position of releasing slots 160a–b will be explained below. As with base 20, the punching out of releasing slots 160a–b and the cutting out of window slot 120 is preferably done prior to the stainless steel sheet of metal being bent to form cover side walls 100a–d. As can best be seen in FIG. 3, the bottom portion of side walls 100a–d are each bent inward and upward to form a ledge 170a, 170b, 170c, 170d on the inside surface of each cover side wall 100a–d. The importance of ledges 170a–d will be explained below. After being thus cut, bent and formed, the joints on the inside of cover 30, where side walls 100a–d meet, are welded (not shown) to add strength to the formed cover 30.

Looking now at FIG. 5, it can be seen that the underside of cover 30 is provided with four clinch studs 180a, 180b, 180c, 180d, projecting from the underside of top 110, in the positions shown. A one half inch wide and one quarter inch thick resilient member, in the form of an elastomeric gasket 185, preferably made of silicone sponge, is affixed to the underside of cover 30 around the inside perimeter of side walls 100a–d with acrylic adhesive, such as No. 467 Adhesive Transfer Tape available from 3M®. The function of gasket 185 will also be explained below.

Figure 4:
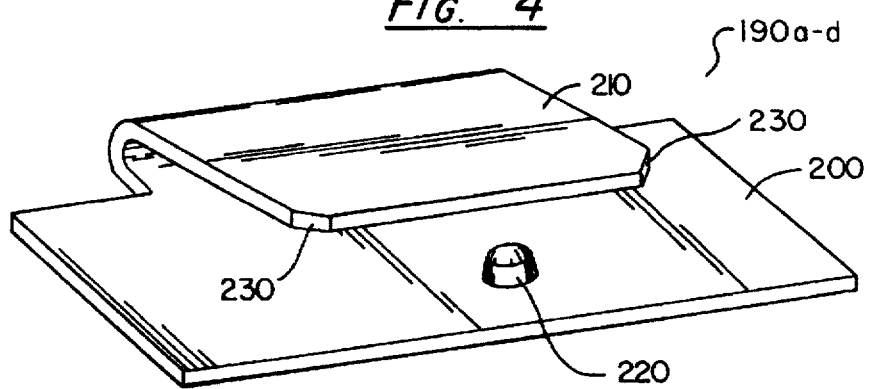
FIG. 4 is a perspective view of the restraining clip shown in FIG. 1.

Referring again to FIG. 1, it can be seen that four restraining clips 190a, 190b, 190c, 190d are connected to base 20. In looking at FIG. 4, the detail of restraining clips 190a–d can be seen. Restraining clips 190a–d are each preferably formed from twenty thousandths of an inch thick spring tempered stainless steel cut and shaped to form a fixed leg 200 and a flexible leg 210. Thus formed, flexible leg 210 behaves like a spring and is movable both towards and away from fixed leg 200. When a force is applied to depress flexible leg 210 toward fixed leg 200 and is then removed, flexible leg 210 will tend to return to its normal, at rest, position. A projection 220 is also provided on fixed leg 200, and is formed beneath flexible leg 210, by coining or punching up through fixed leg 200. Projection 220 thus acts to prevent overtravel and hence breakage of flexible leg 210 as it is deflected toward fixed leg 200 to release cover 30 from base 20, as will be described in greater detail below. The two ends of flexible leg 210 are cut at approximately forty five degree angles, denoted as 230. As will become apparent from the discussion below, cutting the ends of flexible leg 210 eliminates what would otherwise be exposed sharp edges on flexible leg 210 when cover 30 is removed from base 20. Each restraining clip 190a–b is preferably heat treated to provide stress relief and strength after being thus formed.

Referring again to FIG. 1, fixed leg 200 of restraining clips 190a and 190b are spot welded onto surface 60a of side wall 40a and fixed leg 200 of restraining clips 190c and 190d are spot welded onto side wall 40c in the positions shown in FIG. 1. The positioning of restraining clips 190a–d onto base side walls 40a and 40c will be further explained below.

Figure 2:
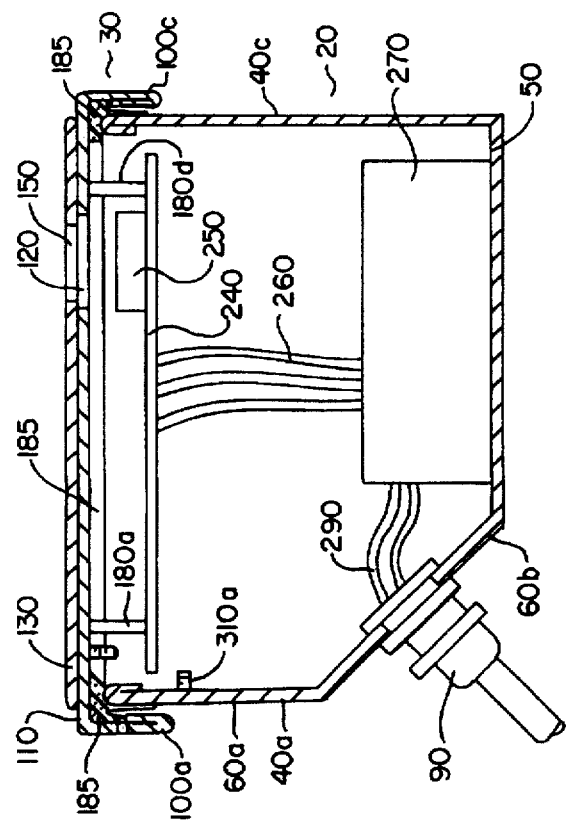
FIG. 2 is a transverse sectional view taken on the line 2—2 of FIG. 1, with the cover secured to the base.

Referring now to FIG. 2, cover 30 can be seen in place on base 20. Printed circuit board 240, containing circuitry to process various signals from a scale, is affixed to the underside of cover 30 with conventional screws threaded into standoffs 180-d. A display panel 250, such as a model DC101MA vacuum fluorescent display available from Noritake Company, Ltd., Japan, is connected to printed circuit board 240 and positioned to be readable through window section 150 of polyester overlay 130 and window slot 120 of cover 30. A flexible circuit (not shown), which is part of overlay 130, connects keyboard assembly 140 (shown in FIG. 1) with printed circuit board 240 through a slot (not shown) cut through top 110 of cover 30. Wiring 260 supplies the necessary electrical connections from printed circuit board 240 to a transformer, generally denoted as box 270, which is mounted to floor 50 of base 20 with clinch studs and nuts (not shown). Other wiring (not shown) connects transformer 270 to a filter, generally denoted as box 280 in FIG. 1, which is also mounted to floor 50 of base 20 with clinch studs and nuts (not shown). Electrical wiring, denoted as 290 in FIG. 2, passes through cord grip bushing 90, is connected to filter 280 to enable connection to external power sources. In like manner, the other various holes 80 through surface 60b can be used to provide access for electrical communication between components and devices outside enclosure 10 with the circuitry inside enclosure 10.

Thus constructed, it can be seen in FIG. 3 that as cover 30 is placed onto base 20, cover side wall 100a will slide over flexible leg 210 of restraining clip 190a until gasket 185 generally rests on top of doubled edge 70a of base side wall 40a. As cover 30 is pushed further down from this position onto base 20, gasket 185 will be compressed by doubled edge 70a and by restraining clip 190a until the end of flexible leg 210 of restraining clip 190a passes beyond the doubled portion of cover side wall 100a and is positioned onto ledge 170a. In this position, flexible leg 210 is contacting ledge 170a and since gasket 185 will oppose compression by doubled edge 70a and restraining clip 190a, gasket 185 will maintain flexible leg 210 in contact with ledge 170a, thereby securing cover 30 to base 20. In similar fashion, the other corners of cover 30 are secured to base 20.

Since gasket 185 extends around the perimeter of cover 30, it will be appreciated that gasket 185 defines a seal between cover 30 and base 20 when cover 30 is thus secured to base 20. Gasket 185 as disclosed has been found to result in a NEMA 4 seal, and when enclosure 10 is made from stainless steel, as disclosed, then enclosure 10 would have a NEMA 4X rating. It should be apparent that use of a thicker gasket would result in greater compression when cover 30 is thus secured to base 20 and hence result in a tighter seal. It should also be apparent that use of a thinner gasket would result in less compression of the gasket and hence a less tight seal.

Thus constructed, it should be appreciated that nothing constrains cover 30 to base 20 when not secured as described above. And that further, wiring 260, connecting printed circuit board 240 to transformer 270 would be subject to possible tension and breakage when cover 30 is not secured to base 20. To prevent breakage of wiring 260, two clinch studs 300a, 300b are provided which project from the underside of cover 30 in the positions shown in FIG. 5. Two other clinch studs 310a, 310b are also provided which project from the inside of base 20 on side wall 40a. The position of clinch stud 310a can be seen in FIG. 2 and FIG. 3. Clinch stud 310b is not shown but is positioned on side wall 40a in a position similar to clinch stud 310a but corresponding to the position of clinch stud 300b on cover 30. One end of a length of metal wire (not shown) is connected with a nut to clinch stud 300a and the other end of the metal wire is similarly connected to clinch stud 310a. Another metal wire of approximately equal length is connected with nuts between clinch studs 300b, 310b. The length of metal wire used is such that when cover 30 is not secured to base 20, the two metal wires maintain cover 30 in sufficiently close proximity to base 20 so that wiring 260 or the connections between transformer 270 and printed circuit board 240 are not damaged when cover 30 is not secured to base 20.

Releasing cover 30 from base 20 after cover 30 has been secured to base 20 is relatively simple and can also be seen by looking at FIG. 3. A screwdriver 320 or other similarly shaped implement is inserted through releasing slot 160a and used to depress flexible leg 210 of restraining clip 190a towards fixed leg 200. Projection 220 prevents overtravel and hence breakage of flexible leg 210 as it moves toward fixed leg 200. As flexible leg 210 moves beyond ledge 170a, the opposition of gasket 185 to compression by double edge 70a and restraining clip 190a will force cover side wall 100a up and over flexible leg 210, thus releasing that corner of cover 30 from base 20. Similarly, screwdriver 320 can be used at releasing slot 160b to release that corner of cover 30. In the configuration of the preferred embodiment, it should be appreciated that it is only necessary to release the two corners of base side wall 40a. Once the tension of gasket 185 is released at the two corners of side wall 40a, cover side wall 100a can then be titled up and moved towards base side wall 40c. This movement will disengage flexible leg 210 of restraining clips 190c,d from their respective ledge 170c, thereby releasing cover side wall 100c to completely release cover 30 from base 20.

Based on the above, it should be apparent that the location of releasing slot 160a is dependent upon the location of ledge 170a and restraining clip 190a, or more particularly, flexible leg 210 of restraining clip 190a. Releasing slot 160a should be positioned above ledge 170a and opposite flexible leg 210 when cover 30 is secured to base 20. Further, releasing slot 160a needs to be of sufficient size to allow screwdriver 320 or other suitable implement to pass therethru to depress flexible leg 210 towards fixed leg 200 to release cover 30 from base 20. In like manner, the position of releasing slot 160b can be determined.

Still referring to FIG. 3, it can also be seen that if the dimensions of cover 30, relative to base 20, are such that when cover 30 is secured to base 20, the gap between cover side wall 100a and its respective base side wall 40a is smaller than the distance which flexible leg 210 of restraining clip 190a extends from fixed leg 200, then flexible leg 210 will be depressed towards fixed leg 200. In which case, flexible leg 210 will exert force against cover side wall 100a, since flexible leg 210 will attempt to return to its normal position. In this fashion, flexible leg 210 thereby maintains cover side wall 100a away from base side wall 40a. By welding the fixed leg 200 of restraining clips 190a–d at locations generally symmetrical on base 20, so that such action of flexible leg 210 of each restraining clip 190a–d opposes such action of flexible leg 210 of another restraining clip 190a–d, as shown in FIG. 1, then the action of flexible legs 210 of restraining clips 190a–d will center cover 30 in the direction perpendicular to base side walls 40a and 40c.

Given the above, it should be apparent that the length of flexible leg 210 as well as the angle between flexible leg 210 and fixed leg 200 when restraining clips 190a–d are in normal position will define the distance between base side wall 40a, 40c and the end of flexible leg 210 for which no force is exerted against cover side wall 100a, 100c. This in turn therefore defines a range within which cover side wall 100a, 100c may extend beyond base side wall 40a, 40c so that force is exerted by flexible leg 210 to maintain cover side wall 100a away from base side wall 40a and cover side wall 100c away from base side wall 40c. Variations in the dimensions of cover 30 and base 20 are acceptable provided that the gap between cover side wall 100a and 100c and its respective base side wall 40a and 40c are within the range for which flexible leg 210 will exert force to maintain cover side wall 100a and 100c away from its respective base side wall 40a and 40c. Thus, it should therefore be appreciated that use of restraining clips 190a–d allows for greater manufacturing tolerances in constructing cover 30 and base 20.

To maximize the increase in tolerances in constructing cover 30 and base 20, restraining clips 190a–d could be mounted roughly midpoint on all four base side walls 40a–d, thus resulting in the centering of cover 30 in both directions relative to base 20, namely in the direction perpendicular to base side walls 40a and 40c and in the direction perpendicular to base side walls 40b and 40d. However, to simplify releasing cover 30 from base 20, it has been found preferable to mount restraining clips 190a–d as shown in FIG. 1 so as to only require releasing one side of cover 30, namely cover side wall 100a, in order to release cover 30 from base 20.

In similar manner, it will be appreciated that use of gasket 185 also allows for greater manufacturing tolerances in mounting fixed leg 200 of restraining clips 190a–d onto base side walls 40a, 40c. Gasket 185, like flexible leg 210, has a range within which opposition to compression will be sufficient to maintain the end of flexible leg 210 in contact with ledge 170a, 170c and thus secure cover 30 to base 20. For enclosure 10 disclosed herein, it has been found that compressing gasket 185 by approximately one half of gasket 185's thickness results in sufficient force to secure cover 30 to base 20. Given this, it should be appreciated that provided flexible leg 210 engages ledge 170a, 170c and provided that gasket 185 is being compressed within such range when cover 30 is secured to base 20, that the vertical position in which fixed leg 200 is required to be mounted to base side wall 40a, 40c is not exact but lies within the range for which gasket 185 will maintain sufficient opposition to compression to secure cover 30 to base 20. Thus, use of gasket 185 allows for greater manufacturing tolerances since fixed leg 200 of restraining clips 190a–d need not be mounted in an exact vertical position on base side walls 40a and 40c. It should also be noted that it is not necessary that restraining clips 190a–d be mounted in a position to contact and compress gasket 185 when cover 30 is secured to base 20. It is sufficient if gasket 185 is compressed, say for example, only by doubled edges 70a–d.

It should also be appreciated that the present invention could be practiced on enclosures of differing shapes or sizes than that of enclosure 10 disclosed herein. For example, a circular, as opposed to rectangular, shaped base and cover could be used. It should also be appreciated that the present invention could also be practiced by using a different number of restraining clips 190a–d from that disclosed herein or by mounting restraining clips 190a–d in different positions on enclosure 10. For example, two restraining clips 190a,b could be employed on base side wall 40a and one restraining clip 190c on base side wall 40c.

What is claimed is:

1. An enclosure comprising:
   a base having a side wall,
   a cover having a top surface and a side wall facing said base side wall when said cover is positioned on said base,
   means defining a ledge on said cover side wall,
   a restraining clip having a fixed leg and a flexible leg movable toward and away from said fixed leg,
   means connecting said fixed leg to said base side wall so that said flexible leg extends toward said cover side wall in position to resiliently contact said ledge when said cover is positioned on said base and whereby said flexible leg urges said cover side wall away from said base side wall,
   a resilient member fastened to said top surface of said cover and positioned to be compressed when said cover is positioned on said base and whereby said flexible leg is maintained by said resilient member in resilient contact with said ledge to secure said cover to said base, and
   said cover side wall includes a hole defined therethru positioned above said ledge and opposite said flexible leg when said cover is secured to said base, said hole being of predetermined size to allow an implement to pass therethru to move said flexible leg towards said fixed leg to disengage said flexible leg from said ledge and release said cover from said base.

2. An enclosure as claimed in claim 1 wherein said cover side wall is doubled over to form said ledge.

3. An enclosure as claimed in claim 1 wherein said resilient member extends around the perimeter of said cover to define a seal between said cover and said base when said cover is secured to said base.

4. An enclosure as claimed in claim 1 wherein said resilient member is made of silicone sponge.

5. An enclosure as claimed in claim 1 wherein said restraining clip includes a projection of predetermined height between said fixed and flexible legs to prevent overtravel of said flexible leg when said flexible leg is moved towards said fixed leg to release said cover from said base.

6. An enclosure comprising:
   a base having a plurality of side walls,
   a cover having a top surface and a plurality of side walls, each said cover side wall facing a base side wall when said cover is positioned on said base,
   means defining a ledge on a first and second cover side walls,
   four restraining clips, each having a fixed leg and a flexible leg movable toward and away from said fixed leg, the fixed legs of a first and second clip being connected to a first base side wall at spaced apart locations, the fixed legs of a third and fourth clip being connected to a second base side wall at spaced apart locations, each said flexible leg extending toward a cover side wall in position to resiliently contact said ledge when said cover is positioned on said base and whereby each said flexible leg urges a cover side wall away from its respective base side wall,
   a resilient member fastened to said top surface of said cover and positioned to be compressed when said cover is positioned on said base and whereby said flexible legs are maintained by said resilient member in resilient contact with said respective ledges to secure said cover to said base, and
   said first cover side wall includes two holes defined therethru, said two holes being positioned above said ledge, one of said holes being opposite said flexible leg of said first clip when said cover is secured to said base and the other said hole opposite said flexible leg of said second clip when said cover is secured to said base, both said holes being of predetermined size to allow an implement to pass therethru to move each said flexible leg towards said respective fixed leg to disengage said flexible leg from said ledge and release said cover from said base.

7. An enclosure as claimed in claim 6 wherein at least two of said cover side walls are doubled over to form said ledge means.

8. An enclosure as claimed in claim 6 wherein said resilient member extends around the perimeter of said cover to define a seal between said cover and said base when said cover is secured to said base.

9. An enclosure as claimed in claim 6 wherein said resilient member is made of silicone sponge.

10. An enclosure as claimed in claim 6 wherein said first base side wall is opposite said second base side wall and said flexible legs resiliently contact a cover side wall to center said cover in a direction perpendicular to said first and second base side walls when said cover is secured to said base.

11. An enclosure as claimed in claim 6 wherein said first and second clips each include a projection of predetermined height between said fixed and flexible legs to prevent overtravel of said flexible leg when said flexible leg is moved towards said fixed leg to release said cover from said base.

12. An enclosure as claimed in claim 6 for housing circuitry to process signals from and display the weight of a load on a scale.

13. An enclosure comprising:

a base having a side wall, a cover having a top surface and a side wall facing said base side wall when said cover is positioned on said base, means defining a ledge on said cover side wall, a restraining clip having a fixed leg and a flexible leg movable toward and away from said fixed leg, means connecting said fixed leg to said base side wall so that said flexible leg extends toward said cover side wall in position to resiliently contact said ledge when said cover is positioned on said base and whereby said flexible leg urges said cover side wall away from said base side wall, a resilient member fastened to said top surface of said cover and positioned to be compressed when said cover is positioned on said base and whereby said flexible leg is maintained by said resilient member in resilient contact with said ledge to secure said cover to said base, and said restraining clip includes a projection of predetermined height between said fixed and flexible legs to prevent overtravel of said flexible leg when said flexible leg is moved towards said fixed leg to release said cover from said base.

14. An enclosure as claimed in claim 13 wherein said cover side wall is doubled over to form said ledge.

15. An enclosure as claimed in claim 13 wherein said resilient member extends around the perimeter of said cover to define a seal between said cover and said base when said cover is secured to said base.

16. An enclosure as claimed in claim 13 wherein said resilient member is made of silicone sponge.

* * * * *